(12) United States Patent
Brennan et al.

(10) Patent No.: US 6,455,919 B1
(45) Date of Patent: Sep. 24, 2002

(54) INTERNALLY BALLASTED SILICON GERMANIUM TRANSISTOR

(75) Inventors: Ciaran J. Brennan, Essex, VT (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/811,979

(22) Filed: Mar. 19, 2001

(51) Int. Cl.[7] .............................................. H01L 31/117
(52) U.S. Cl. ...................... 257/616; 257/361; 257/362; 257/580; 257/582
(58) Field of Search ................................ 257/197, 201, 257/361, 362, 532, 536, 539, 580, 581, 582

(56) References Cited

U.S. PATENT DOCUMENTS

| | | |
|---|---|---|
| 4,441,116 A | 4/1984 | Widlar |
| 4,656,496 A | 4/1987 | Widlar |
| 4,800,416 A | 1/1989 | Musemeci |
| 4,972,247 A | 11/1990 | Patterson et al. |
| 5,212,618 A | 5/1993 | O'Neill et al. |
| 5,223,737 A | 6/1993 | Canclini |
| 5,272,371 A | 12/1993 | Bishop et al. |
| 5,374,844 A | 12/1994 | Moyer |
| 5,602,409 A | 2/1997 | Olney |
| 5,689,133 A | 11/1997 | Li et al. |
| 5,760,457 A * | 6/1998 | Mitsui et al. ................ 257/197 |
| 5,808,342 A | 9/1998 | Chen et al. |
| 5,846,867 A | 12/1998 | Gomi et al. |
| 5,990,520 A * | 11/1999 | Noorlag et al. .............. 257/361 |

* cited by examiner

Primary Examiner—David Nelms
Assistant Examiner—Mai-Huong Tran
(74) Attorney, Agent, or Firm—Schmeiser, Olsen & Watts; Richard A. Henkler

(57) ABSTRACT

A bipolar transistor is disclosed. The bipolar transistor comprises: a silicon substrate; a collector formed in the semiconductor substrate, a base formed over the collector, the base having an intrinsic base region and an extrinsic base region, the extrinsic base region forming an internal resistor, an emitter formed over the intrinsic base region; and a dielectric layer formed between the extrinsic base region and the collector, the extrinsic base region. the dielectric layer and the collector forming an internal capacitor. The base of the transistor may be silicon-germanium.

21 Claims, 7 Drawing Sheets

INTERNALLY BALLASTED SILICON GERMANIUM TRANSISTOR

FIELD OF THE INVENTION

The present invention relates to the field of bipolar transistors; more specifically, it relates to an internally ballasted silicon germanium bipolar transistor and the method of fabricating an internally ballasted silicon germanium bipolar transistor.

BACKGROUND OF THE INVENTION

Integrated circuits routinely include on-die circuits for electrostatic discharge (ESD). ESD phenomenon causes a high voltage and/or current to be impressed across the terminals of a device. Both voltage and current spikes may occur. These spikes, usually of very short duration, can break down the isolation or diffusions in various portions of individual semiconductor devices, thus rending the entire device completely or partially inoperable.

There are three models in use to describe ESD, the human body model, the 400-volt machine model and the charge device model. In the human body model a 4 KV pulse is assumed with a maximum current of 2.6 amperes with a 150 ns event time. In the 400-volt machine model, a maximum of 7 amperes is assumed with a 10 ns event time. In the charge device model, voltages as high as one KV and currents of 9 to 10 amperes with 0.25 ns event times are assumed. In general, ESD events occur at frequencies lower than five GHz.

Capacitive loading becomes a major concern for chips running at high frequencies, i.e. greater than one GHz, as the capacitive loading of conventional ESD devices has an adverse effect on device performance. The total capacitance looking into a device is given by:

$$C_{TOT} = C_{CKT} + C_{ESD}$$

Wherein:
$C_{TOT}$=the capacitance looking into the die from an I/O pad;
$C_{CKT}$=capacitance of the circuit being protected; and
$C_{ESD}$=ESD device capacitance.

High-frequency circuits are designed with low capacitance, $C_{CKT}$, but ESD circuits and devices have relatively high capacitance's. $C_{TOT}$ can become driven by $C_{ESD}$ and the chip fails to perform. One problem in fabricating low capacitance high frequency ESD devices and circuits is the maximum value of capacitance that can be tolerated. For example, at 1 GHz a capacitance of 1 pF is acceptable, but at 10 GHz, the capacitance must be in the order of 0.1 pF, which is difficult to achieve, and for 100 GHz the capacitance would need to be around 0.01 pF, very difficult (if even possible) to achieve with conventional ESD protection circuits.

A major use of silicon-germanium (SiGe) is in high-frequency circuits. SiGe bipolar transistors comprise a base comprised of a SiGe polysilicon region surrounding a SiGe epitaxial silicon region, the base region being located between a collector structure (normally a N+ pedestal integral to and raised above a subcollector) and an N+ polysilicon emitter. It would be particularly desirable to be able to fabricate ESD resistant SiGe devices for use in either high-frequency ESD protect circuits or for high-frequency driver/receiver (D/R) circuits.

SUMMARY OF THE INVENTION

A first aspect of the present invention is a bipolar transistor, comprising: a silicon substrate; a collector formed in the semiconductor substrate; a base formed over the collector, the base having an intrinsic base region and an extrinsic base region, the extrinsic base region forming an internal resistor; an emitter formed over the intrinsic base region; and a dielectric layer formed between the extrinsic base region and the collector, the extrinsic base region, the dielectric layer and the collector forming an internal capacitor.

A second aspect of the present invention is a bipolar transistor, comprising: a silicon substrate; a collector formed in the semiconductor substrate; a base formed over the collector, the base having an intrinsic base region and an extrinsic base region, the extrinsic base region forming an internal resistor between the base and a base contact; an emitter formed over the intrinsic base region; and a dielectric layer formed between the extrinsic base region and the collector, the extrinsic base region, the dielectric layer and the collector forming an internal capacitor between the base and a collector contact.

A third aspect of the present invention is a bipolar transistor, comprising: a silicon substrate, a sub-collector formed in the silicon substrate between a lower portion and an upper portion of the silicon substrate; a collector formed in the upper portion of the silicon substrate and over a portion of the subcollector, the collector contacting the subcollector and extending to a top surface of the silicon substrate; a base formed over the sub-collector, the base having an intrinsic base region and an extrinsic base region, the extrinsic base region forming an internal resistor; an emitter formed over the intrinsic base region; and a dielectric layer formed between the extrinsic base region and the upper portion of the silicon substrate. the extrinsic base region, the dielectric layer and the upper portion of the silicon substrate forming an internal capacitor.

A fourth aspect of Fe present invention is a method of fabricating a bipolar transistor, comprising: providing a silicon substrate; forming a sub-collector in the silicon substrate between a lower portion and an upper portion of the silicon substrate; forming a collector in the upper portion of the silicon substrate and over a portion of the subcollector, the collector contacting the subcollector and extending to a top surface of the silicon substrate; forming a first dielectric layer on a top surface of the silicon substrate; forming a base layer on top of the first dielectric layer and forming an opening in the first dielectric layer, the opening aligned over the collector; the base layer having an intrinsic base region aligned over the collector and a surrounding extrinsic base region; the extrinsic base region forming an internal resistor between an extrinsic base contact and the upper portion of the silicon substrate, and the extrinsic base region, the first dielectric layer and the upper portion of the silicon substrate forming an internal capacitor; forming a second dielectric layer; and forming an emitter layer on top of second dielectric layer and in an opening formed in the second dielectric layer, the opening aligned over the intrinsic base region.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
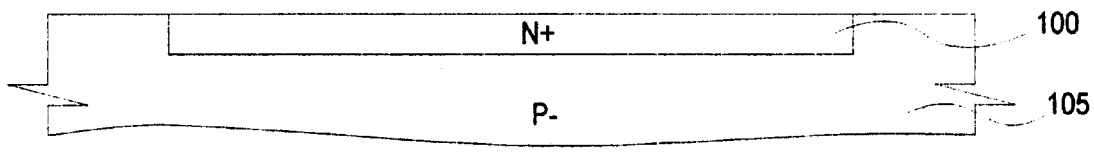
FIGS. 1 through 17 show partial cross-sectional views of the fabrication of a silicon-germanium bipolar transistor according to the present invention.

FIGS. 1 through 17 are partial cross-sectional views of the fabrication of a silicon-germanium bipolar transistor according to the present invention. In FIG. 1, a subcollector 100 is formed in a silicon substrate 105 by an ion implantation process. In one example substrate 105 is doped P type with boron to a concentration of about $1.0 \times 10^{14}$ to $1.0 \times 10^{17}$ atm/cm$^3$ and collector 100 is formed by implantation of arsenic at a dose of $1.5 \times 10^{15}$ to $1.5 \times 11^{17}$ atm/cm$^2$ at an implant energy of about 20 to 60 Kev using a photoresist mask.

Figure 2:
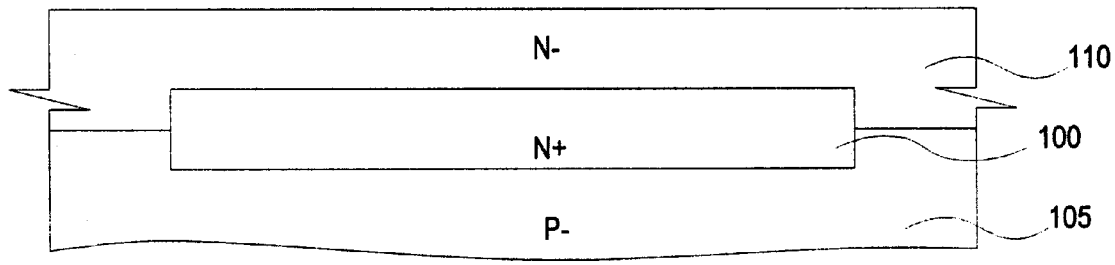

In FIG. 2, an epitaxial silicon layer 110 is grown on top of silicon substrate 105 and subcollector 100. Subcollector 100 out diffusions into epitaxial silicon layer. In one example, epitaxial silicon layer 110 is doped with arsenic to less than about $3 \times 10^{15}$ atm/cm$^2$ and is 600 to 1000 nm in thickness.

Figure 3:
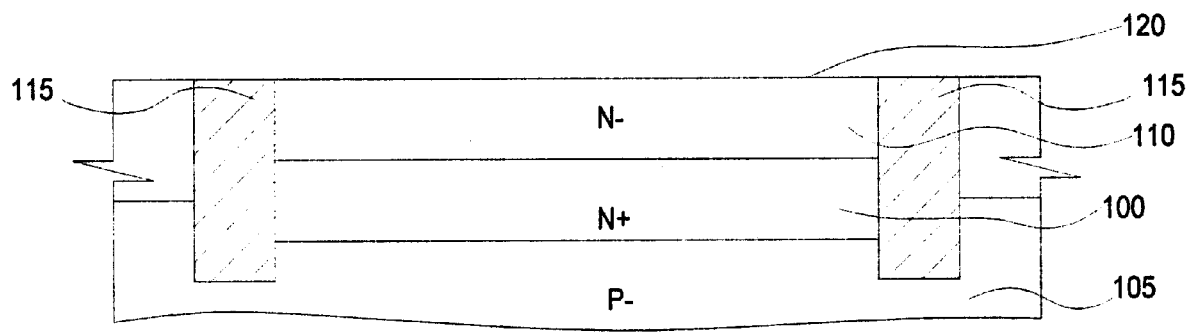

In FIG. 3, a deep trench isolation 115 is formed from a top surface 120 of epitaxial silicon layer 110 into silicon substrate 105. Deep trench isolation 115 abuts subcollector 100 and extends deeper into silicon substrate 105 then does the subcollector. Deep trench isolation 115 may be formed by a masking process, followed by a reactive ion etch (RIE) silicon etch to form trenches, followed by a oxide deposition to fill the trenches, followed by a chemical-mechanical-polish (CMP) step to planarize the deposited oxide back to top surface 120.

Figure 4:
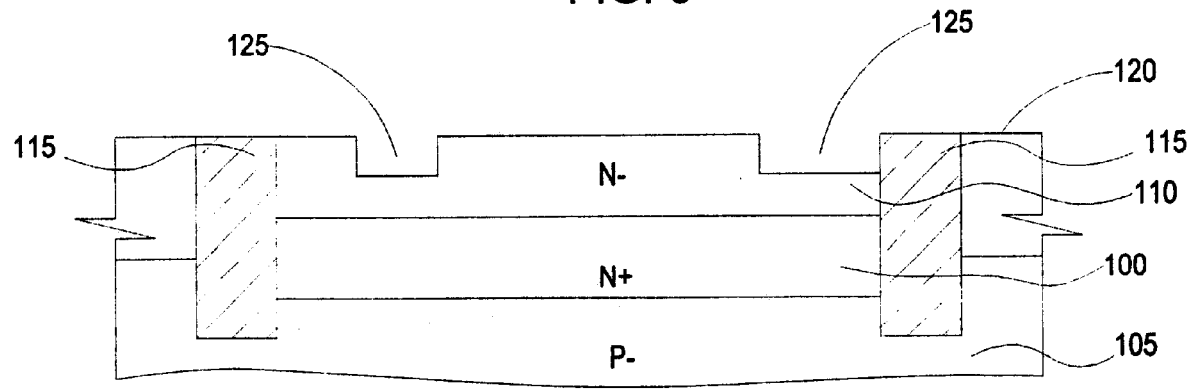
Figure 5:
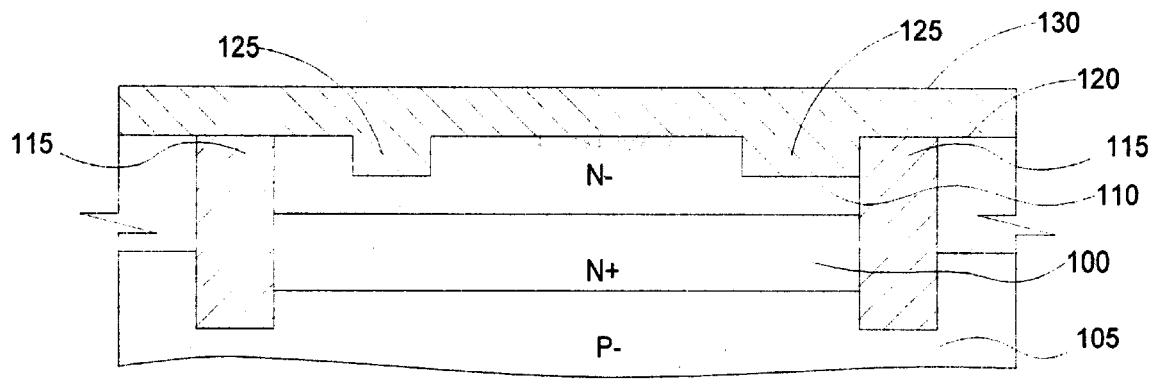

In FIG. 4, shallow trenches 125 are formed in epitaxial silicon layer 110 and in FIG. 5, an oxide layer 130 is deposited on top surface 120 of epitaxial layer 110 and in shallow trenches 125, completely filling the trenches.

Figure 6:
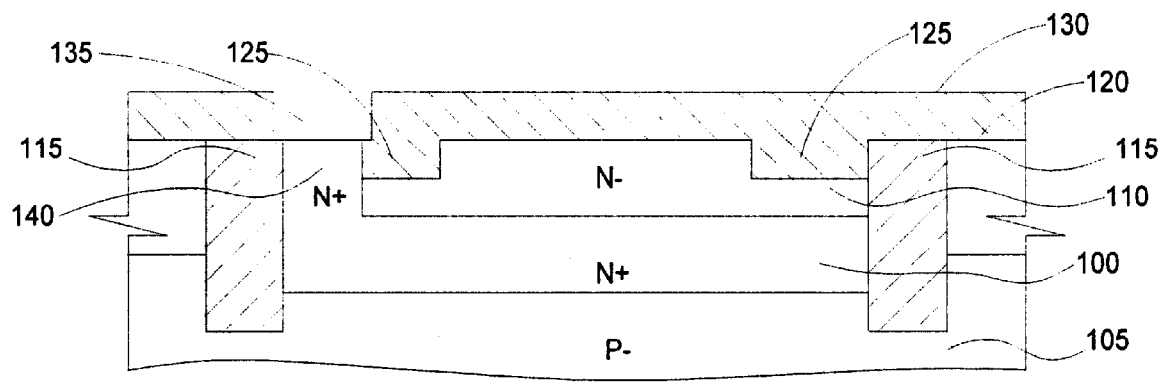

In FIG. 6, an opening 135 is made in oxide layer 130 by conventional lithographic and etching processes and a collector reach-through 140 is formed. Collector reach-through 140 reaches-through silicon epitaxial layer 110 to contact subcollector 100. In one example, collector reach-through 140 is formed by ion implantation of antimony at a dose of $1.2 \times 10^{13}$ to $1.2 \times 10^{15}$ atm/cm$^2$ at an implant energy of about 100 to 300 Kev followed by a phosphorus implant at a dose of $4 \times 10^{14}$ to $4 \times 10^{16}$ atm/cm$^2$ at an implant energy of about 35 to 105 Kev using oxide layer 130 and photoresist as a mask.

Figure 7:
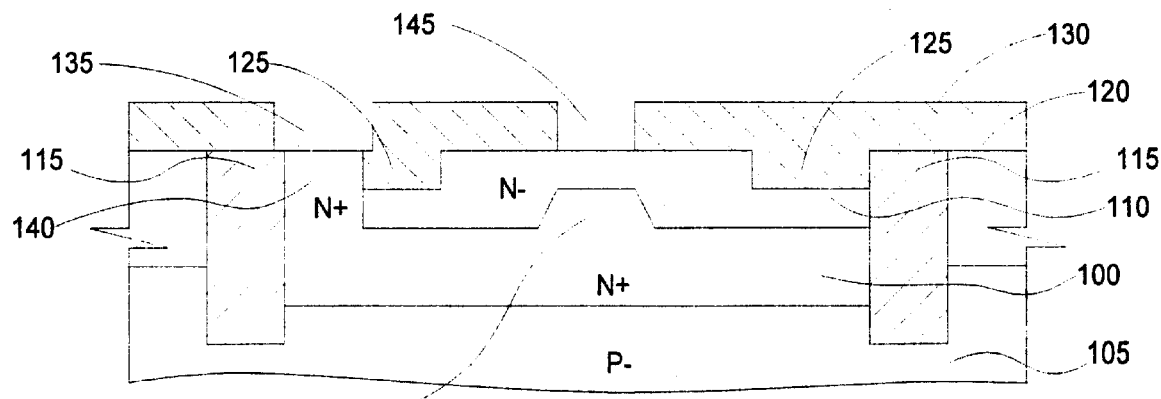

In FIG. 7, an opening 145 is made in oxide layer 130 by conventional lithographic and etching processes and a pedestal 150 is formed. Pedestal 150 contacts subcollector 100 and extends into silicon epitaxial layer 110. In one example, pedestal 150 is formed by a first ion implantation of phosphorus at a dose of $4 \times 10^{12}$ to $4 \times 10^{14}$ atm/cm$^2$ at an implant energy of about 110 to 330 Kev followed by a second phosphorus implant at a dose of $2 \times 10^{12}$ to $2 \times 10^{14}$ atm/cm$^2$ at an implant energy of about 30 to 90 Kev using oxide layer 130 and photoresist as a mask.

Figure 8:
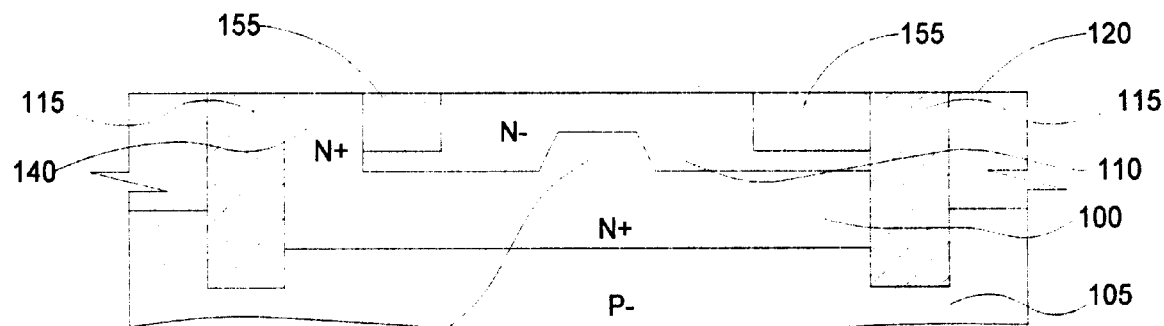
Figure 9:
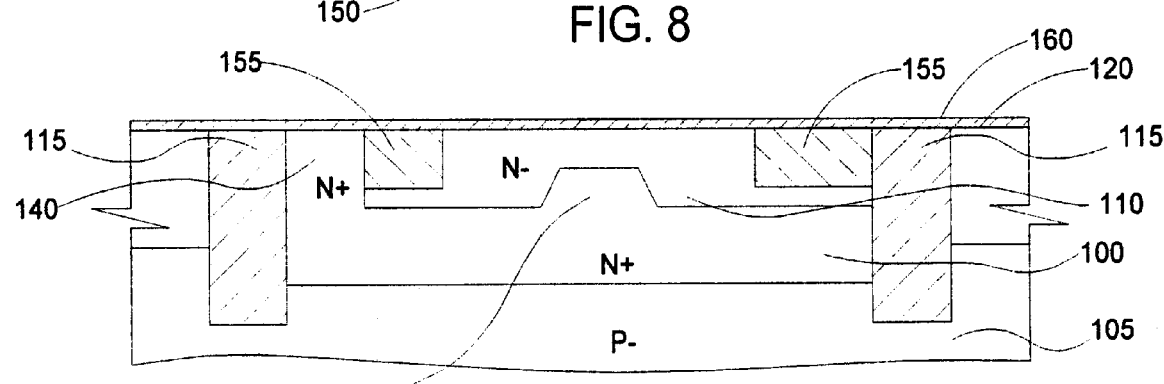

In FIG. 8, oxide layer 130 is planarized back to top surface 120 of silicon epitaxial layer 110 in a CMP step to form a shallow trench isolation (STI) 155. In FIG. 9, a dielectric layer 160 is deposited on top surface 120 of silicon epitaxial layer 110. In one example, dielectric layer 160 is tetraethoxysilane (TEOS) oxide formed by low-pressure chemical vapor deposition (LPCVD) or by plasma enhanced chemical vapor deposition (PECVD) as is about 200 to 400 Å in thickness. In another example, dielectric layer 160 is formed from silicon nitride by a LPCVD or PECVD process and is about 50 to 200 Å in thickness. Dielectric layer 160 may also be formed from a combination of silicon oxide and silicon nitride films. The thickness of dielectric layer 160 is important to control, as it will be one of the factors determining the capacitance of the silicon germanium transistor of the present invention.

Figure 10:
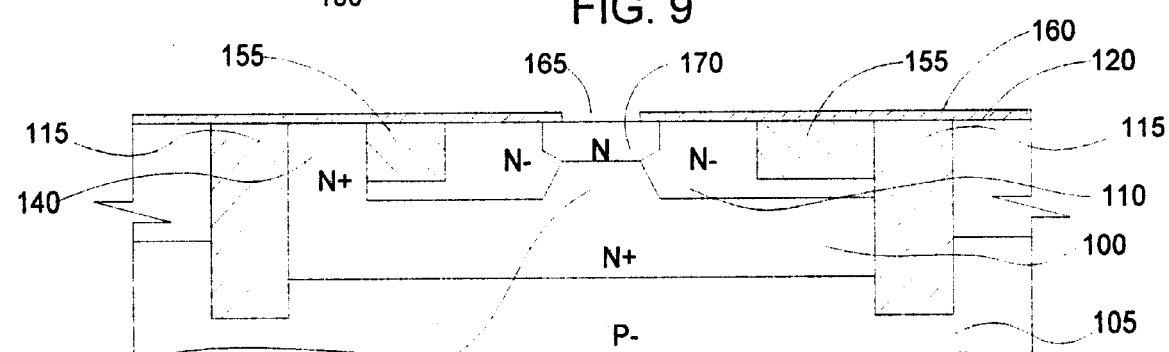

In FIG. 10, an opening 165 is formed in exide layer 160 by conventional lithographic and etching processes and a collector 170 is formed in silicon epitaxial layer 110. Collector 170 extends from top surface 120 of silicon epitaxial layer 110 to pedestal 150. In one example, collector 170 is formed by ion implantation of phosphorus at a dose of $1 \times 10^{12}$ to $1 \times 10^{14}$ atm/cm$^2$ at an implant energy of about 80 to 240 Kev using oxide layer 160 and photoresist as a mask.

Figure 11:
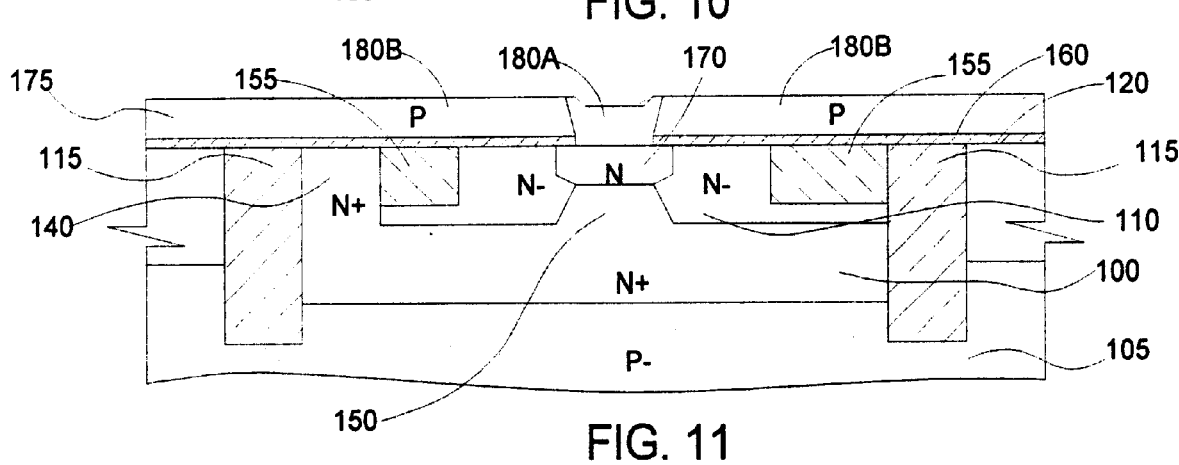

In FIG. 11, a SiGe layer 175 is grown on top of dielectric layer 160. In one example, SiGe layer 175 comprises about 10 to 25% germanium, about 0 to 5% carbon and about 85% or less silicon. Over collector 170, SiGe layer 175 forms an epitaxial SiGe intrinsic base region 180A and over dielectric layer 160, the SiGe layer forms a polysilicon SiGe extrinsic base region 180B.

Figure 12:
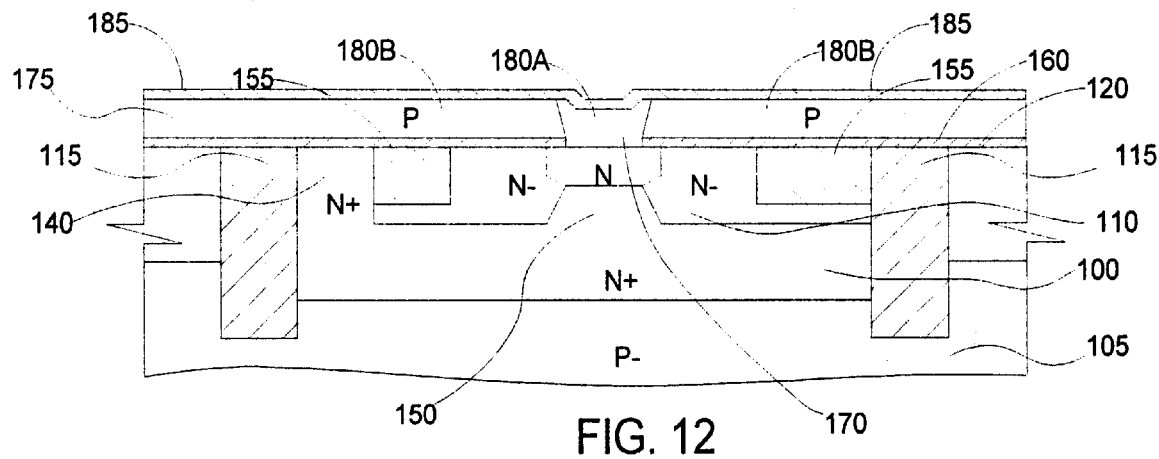

In FIG. 12, a dielectric layer 185 is deposited top of SiGe layer 175. In one example, dielectric layer 185 is tetraethoxysilane (TEOS) oxide formed by low-pressure chemical vapor deposition (LPCVD) or by plasma enhanced chemical vapor deposition (PECVD) as is about 200 to 400 Å in thickness. In another example, dielectric layer 185 is formed from silicon nitride by a LPCVD or PECVD process and is about 50 to 200 Å in thickness.

Figure 13:
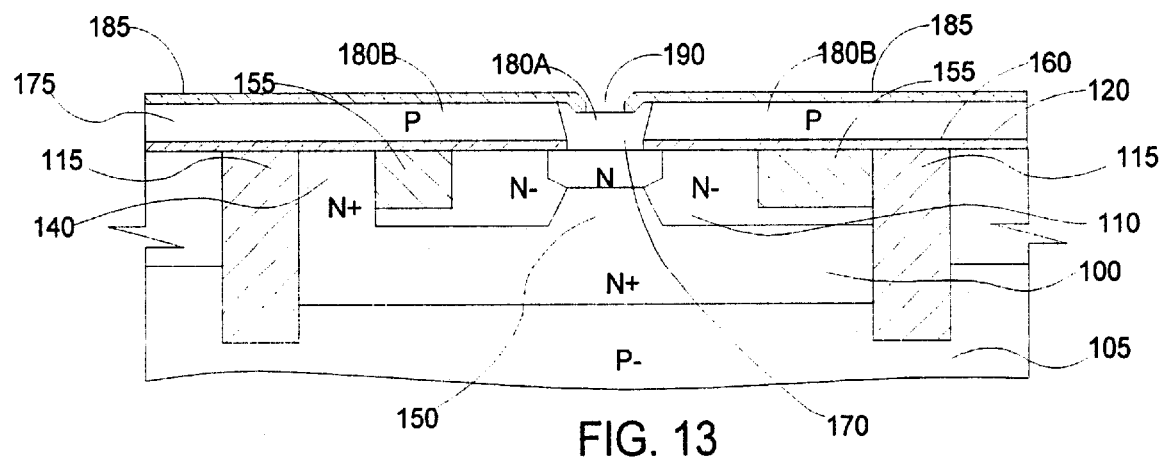
Figure 14:
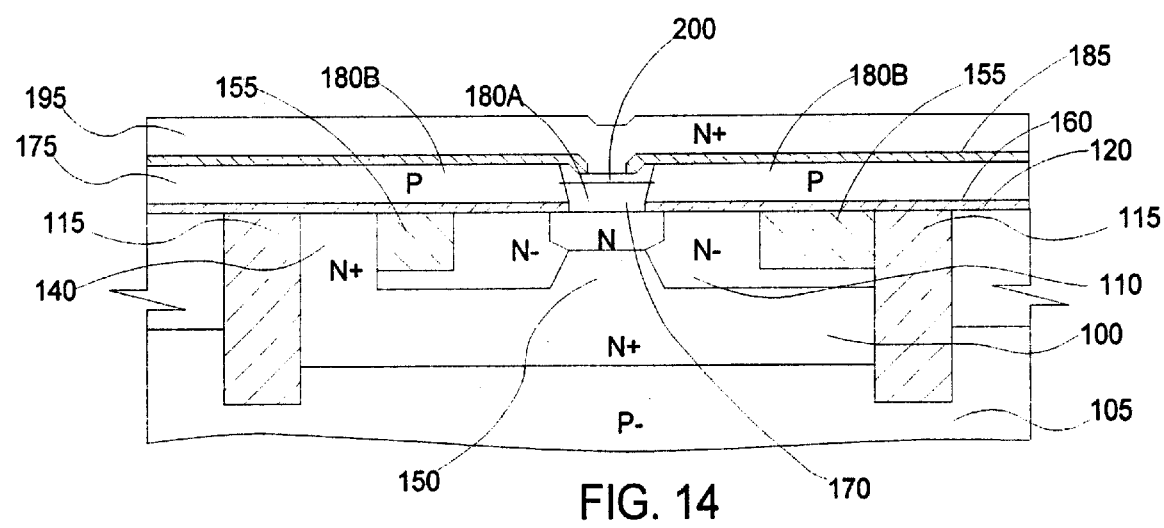

In FIG. 13, an opening 190 is formed in dielectric layer 185 by conventional lithographic and etching processes. Opening 190 is formed over collector 170. In FIG. 14, a polysilicon layer 195 is deposited over dielectric layer 185 by LPCVD or PECVD.

In one example polysilicon layer 195 is undoped polysilicon and is 80 to 240 Å in thickness. Undoped polysilicon layer 195 is then doped by implantation with arsenic at a dose of $1.6 \times 10^{15}$ to $1.6 \times 10^{17}$ atm/cm$^2$ at an implant energy of about 20 to 60 Kev. After an anneal step a lower portion of now arsenic doped polysilicon layer 195 in contact with intrinsic base region 180A re-crystallizes to form an emitter 200. In one example, the anneal step is performed at about 500 to 800° C. under nitrogen for about 15 to 30 minutes.

Figure 15:
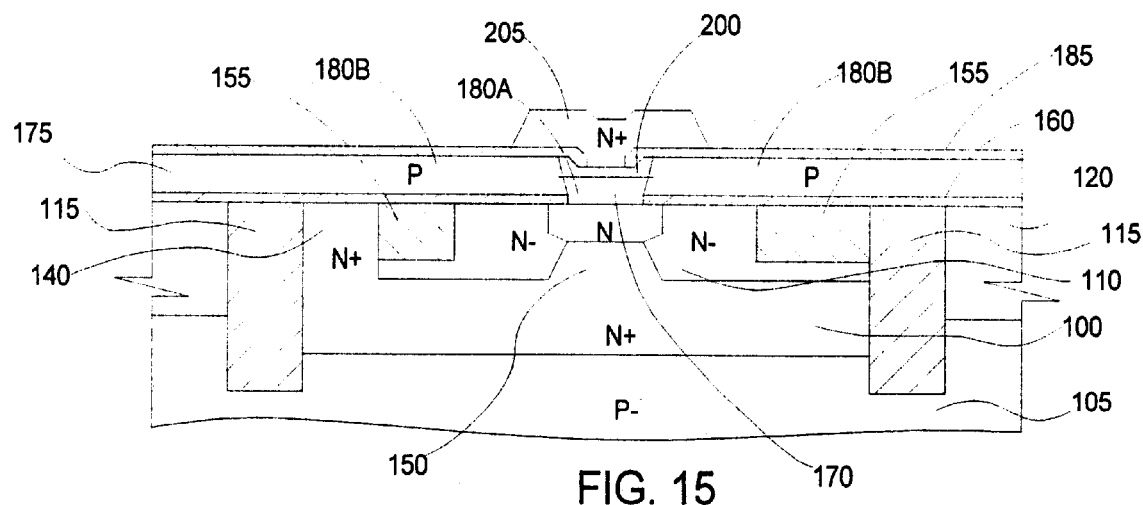
Figure 16:
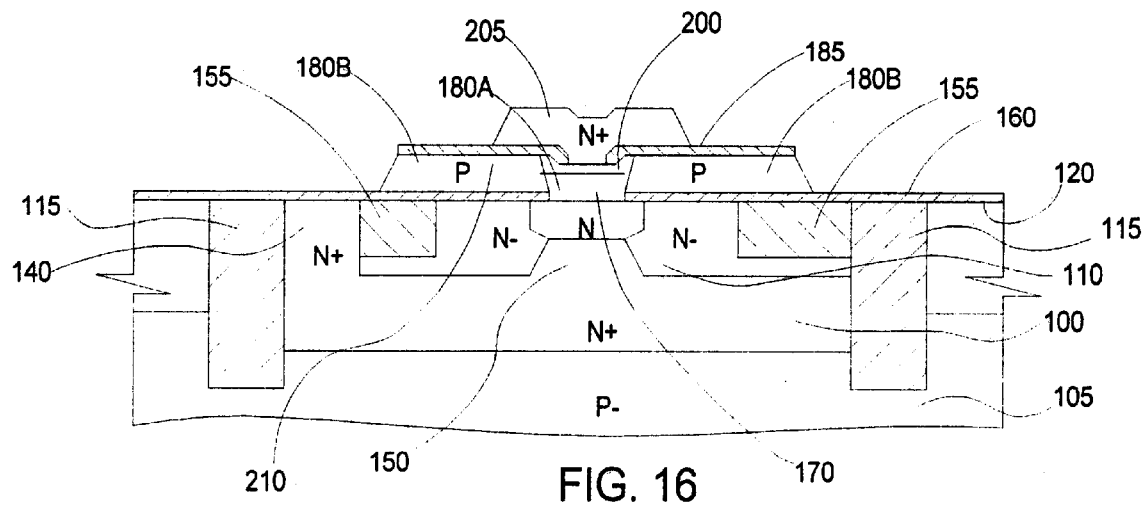
Figure 17:
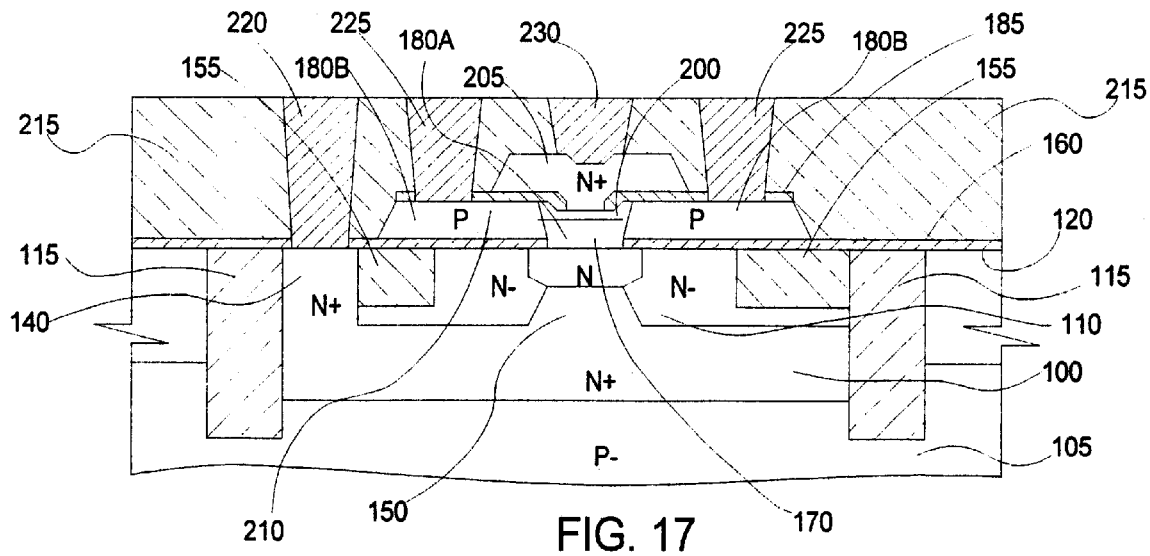

In FIG. 15, a portion of polysilicon layer is removed using a photoresist mask and an RIE process to form an upper emitter 205. In FIG. 16, a portion of dielectric layer 185 and a portion of SiGe layer 175 are removed using a photoresist mask and an RIE process to form an base region 210. Finally, in FIG. 17, an interlevel dielectric layer 215 is deposited and planarized in a CMP step. In one example, interlevel dielectric layer 215 comprises a lower PECVD silicon nitride layer of about 25 to 75 Å in thickness; a middle PECVD boro-phosphorous silicate glass (BPSG) of about 600 to 1800 Å in thickness; and an upper PECVD TEOS layer of about 160 to 480 Å in thickness. A collector contact 220 is formed in interlevel dielectric layer 215 to form electrical contact with collector reach-through 140. A base contact 225 is also formed in interlevel dielectric layer 215 to form electrical contact with polysilicon SiGe extrinsic base region 180B. An emitter contact 230 is also formed in interlevel dielectric layer 215 to form electrical contact with upper emitter 205. Contacts 220, 225 and 230 may be formed, for example, from aluminum, tungsten or a titanium nitride/titanium liner-tungsten core metallurgy.

Figure 18:
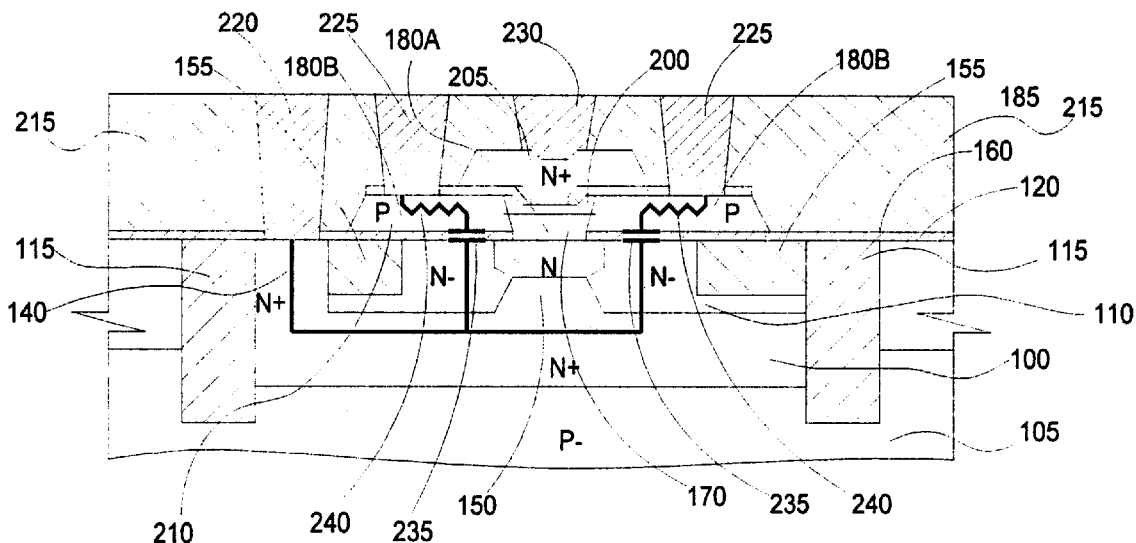
FIG. 18 is a partial cross-sectional view pointing out the internal ballast of the silicon-germanium bipolar transistor of the present invention.

FIG. 18 is a partial cross-sectional view pointing out the internal ballast of the silicon-germanium bipolar transistor of the present invention. In FIG. 18, dielectric layer 160 acts as the dielectric for an internal capacitor 235. Extrinsic polysilicon region ISOB and epitaxial silicon layer 110 form the plates of internal capacitor 235. Extrinsic polysilicon region 180B also forms an internal resistor 240 between base contact 225 and epitaxial silicon layer 110. For an extrinsic polysilicon region 180B, doped to a concentration of about $1.0 \times 10^{17}$ to $1.0 \times 10^{19}$ atm/cm$^3$ internal resistor 240 would have a sheet resistance of about of about 1 to 10 KΩ/square. For the same extrinsic polysilicon region ISOB area and a dielectric layer 160 comprised of TEOS oxide 300 Å thick, internal capacitor 235 would have a capacitance of about $10^{-3}$ pf.

Figure 19:
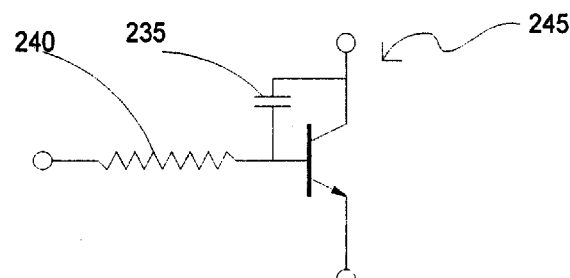
FIG. 19 is a schematic circuit diagram of the silicon-germanium bipolar transistor of the present invention.

FIG. 19 is a schematic circuit diagram of the silicon-germanium bipolar transistor of the present invention. In FIG. 19, silicon germanium bipolar transistor 245 includes internal capacitor 235 coupled between the collector and base of the transistor and internal resistor 240 in series with the base of the transistor.

Figure 20:
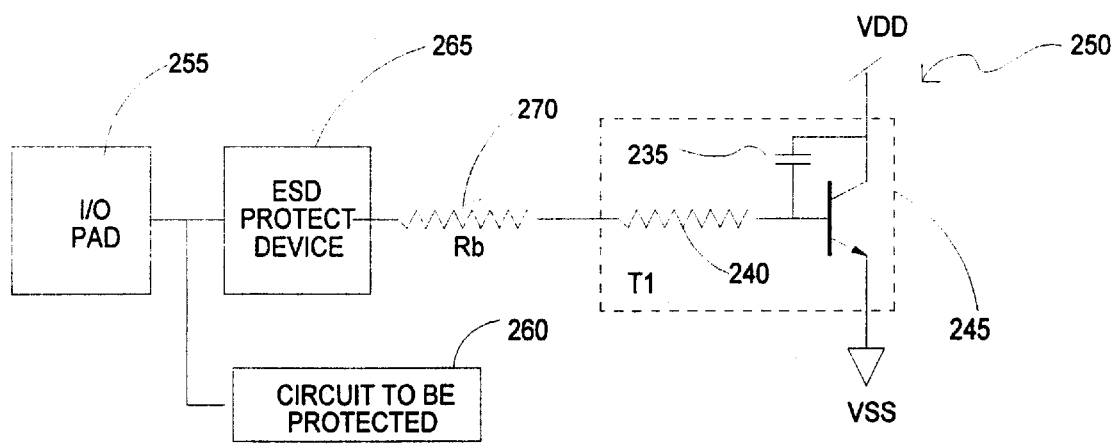
FIG. 20 is an exemplary ESD protect circuit using the silicon-germanium bipolar transistor of the present invention.

FIG. 20 is an exemplary ESD protect circuit using the silicon-germanium bipolar transistor of the present invention. ESD protect circuit 250 includes an I/O pad 255 coupled to a circuit to be protected 260. I/O pad 255 is also coupled to an ESD protection device 265. In one example, external ESD device 265 is comprised of SiGe Schottky diodes, SiGe transistors, SiGe varistors or SiGe diodes. External ESD device 265 is coupled to an external ballast resistor 270. External ballast resistor 270 is coupled to the base of silicon germanium bipolar transistor 245. The collector of silicon germanium bipolar transistor 245 is tied to $V_{DD}$ and the emitter of the transistor is tied to $V_{SS}$.

Figure 21:
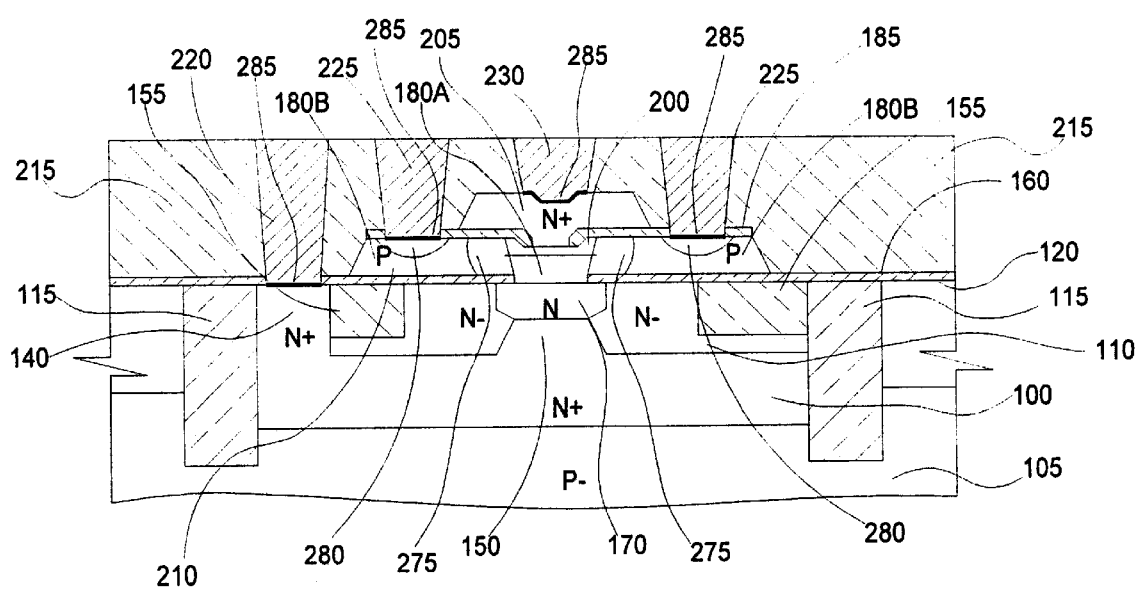
FIG. 21 is partial a cross-sectional view showing alternative features of the silicon-germanium bipolar transistor according to the present invention.

FIG. 21 is partial a cross-sectional view showing alternative features of the silicon-germanium bipolar transistor according to the present invention. Formed in a portion of extrinsic polysilicon region 180B abutting intrinsic polysilicon region 180A is a first highly doped base region 275. Formed in a portion of extrinsic polysilicon region 180B abutting base contact 225 is a second highly doped base region 280. Second highly doped region 280 improves contact to extrinsic polysilicon region 180B. Both first and second highly doped regions 275 and 280 may be formed by ion implantation of boron. In one example, first highly doped region 275 has a sheet resistance of about 5 KΩ/square and second highly doped region 280 has a sheet resistance of about 10 KΩ/square.

Also illustrated in FIG. 21 are silicide contact regions 285. In one example, silicon contact regions 285 are cobalt or titanium silicide. Silicide contact regions 285 may be formed by deposition of cobalt or titanium onto exposed silicon, followed by an anneal and wet etch. Silicide contact regions 285 lower the resistance between the metal of the contacts and the silicon portions of the transistor.

The description of the embodiments of the present invention is given above for the understanding of the present invention. It will be understood that the invention is not to the particular embodiments described herein, but is capable of various modifications, rearrangements and substitutions will now become apparent to those skilled in the art without departing from the scope of the invention. Therefore it is intended that the following claims cover all such modifications and changes as fall within the true spirit and scope of the invention.

What is claimed is:

1. A bipolar transistor, comprising:
   a silicon substrate;
   a collector formed in said semiconductor substrate;
   a base formed over said collector, said base having an intrinsic base region and an extrinsic base region, said extrinsic base region forming an internal resistor;
   an emitter formed over said intrinsic base region; and
   a dielectric layer formed between said extrinsic base region and said collector, said extrinsic base region, said dielectric layer and said collector forming an internal capacitor having a plate electrically connected to a collector contact.

2. The bipolar transistor of claim 1, wherein said base comprises silicon germanium.

3. The bipolar transistor of claim 1, wherein said intrinsic base region includes an epitaxial region and said extrinsic base region includes a polysilicon region.

4. The bipolar transistor of claim 3, further including a highly doped region formed in said polysilicon region, said highly doped region abutting said intrinsic region.

5. The bipolar transistor of claim 3, wherein said emitter includes a re-crystallized region contacting said epitaxial region.

6. The bipolar transistor of claim 1, wherein said emitter includes a polysilicon region.

7. A bipolar transistor, comprising:
   a silicon substrate;
   a collector formed in said semiconductor substrate;
   a base formed over said collector, said base having an intrinsic base region and an extrinsic base region, said extrinsic base region forming an internal resistor between said base and a base contact;
   an emitter formed over said intrinsic base region; and
   a dielectric layer formed between said extrinsic base region and said collector, said extrinsic base region, said dielectric layer and said collector forming an internal capacitor having a plate electrically connected to a collector contact.

8. The bipolar transistor of claim 7, wherein said base comprises silicon germanium.

9. The bipolar transistor of claim 7, wherein said intrinsic base region includes an epitaxial region and said extrinsic base region includes a polysilicon region.

10. The bipolar transistor of claim 9, further including a highly doped region formed in said polysilicon region, said highly doped region abutting said intrinsic region.

11. The bipolar transistor of claim 9, wherein said emitter includes a re-crystallized region contacting said epitaxial region.

12. The bipolar transistor of claim 7, wherein said emitter includes a polysilicon region.

13. A bipolar transistor, comprising:
   a silicon substrate;
   a sub-collector formed in said silicon substrate between a lower portion and an upper portion of said silicon substrate;
   a collector formed in said upper portion of said silicon substrate and over a portion of said subcollector, said collector contacting said subcollector and extending to a top surface of said silicon substrate;
   a base formed over said sub-collector, said base having an intrinsic base region and an extrinsic base region, said extrinsic base region forming an internal resistor;

an emitter formed over said intrinsic base region; and a dielectric layer formed between said extrinsic base region and said upper portion of said silicon substrate, said extrinsic base region, said dielectric layer and said upper portion of said silicon substrate forming an internal capacitor having a plate electrically connected to a collector contact.

14. The bipolar transistor of claim 13, wherein said base comprises silicon germanium.

15. The bipolar transistor of claim 13, wherein said intrinsic base region includes an epitaxial region and said extrinsic base region includes a polysilicon region.

16. The bipolar transistor of claim 15, further including a highly doped region formed in said polysilicon region, said highly doped region abutting said intrinsic region.

17. The bipolar transistor of claim 15, wherein said emitter includes a re-crystallized region contacting said epitaxial region.

18. The bipolar transistor of claim 13, wherein said emitter includes a polysilicon region.

19. The bipolar transistor of claim 13, further including a deep trench isolation extending from said surface of said silicon substrate into said lower portion of said silicon substrate, said deep trench abutting said sub-collector.

20. The bipolar transistor of claim 13, further including a shallow trench isolation extending from said surface of said silicon substrate into said upper layer of said silicon substrate and extending under a periphery of said extrinsic base region away from said intrinsic base region.

21. The bipolar transistor of claim 13, further including a pedestal region of said sub-collector, said pedestal region extending from said subcollector toward said surface of said silicon substrate.

* * * * *